(12) United States Patent
Kobayashi (10) Patent No.: US 8,542,487 B2
(45) Date of Patent: Sep. 24, 2013

(54) MOUNTING DEVICE AND AN AIR FLOW CONTROL DEVICE

(75) Inventor: Shinichi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 213 days.

(21) Appl. No.: 13/224,634

(22) Filed: Sep. 2, 2011

(65) Prior Publication Data

US 2012/0075803 A1 Mar. 29, 2012

(30) Foreign Application Priority Data

Sep. 24, 2010 (JP) .................................. 2010-214433

(51) Int. Cl.
*H05K 7/20* (2006.01)

(52) U.S. Cl.
USPC ........................................... 361/695; 454/184

(58) Field of Classification Search
USPC .......................................................... 361/695
See application file for complete search history.

(56) References Cited

U.S. PATENT DOCUMENTS

| | | | | |
|---|---|---|---|---|
| 5,528,455 A | * | 6/1996 | Miles | 361/695 |
| 6,047,836 A | * | 4/2000 | Miles | 211/41.17 |
| 6,278,608 B1 | * | 8/2001 | Ater et al. | 361/695 |
| 2004/0252453 A1 | * | 12/2004 | Brooks et al. | 361/687 |
| 2004/0252456 A1 | * | 12/2004 | Larson et al. | 361/694 |
| 2007/0002536 A1 | * | 1/2007 | Hall et al. | 361/695 |
| 2007/0243814 A1 | * | 10/2007 | Makabe | 454/184 |

FOREIGN PATENT DOCUMENTS

| JP | 11-204974 A | 7/1999 |
|---|---|---|
| JP | 2007-73720 A | 3/2007 |

* cited by examiner

*Primary Examiner* — Gregory Thompson
(74) *Attorney, Agent, or Firm* — Fujitsu Patent Center

(57) ABSTRACT

A mounting device includes a housing for accommodating electronic units, a fan for sending cooling air to the electronic units and air flow control devices for controlling flow of the cooling air. Each air flow control device includes a first panel having at least one opening for the cooling air to pass therethrough, a second panel, slidably provided to overlap the first panel, for opening or closing the opening of the first panel, a driving force generation mechanism provided in the airflow path for cooling air and having an air receiving member for receiving an air pressure of the cooling air, the driving force generation mechanism for generating a driving force corresponding to the air pressure received by the air receiving member and a link mechanism, for receiving the driving force generated by the driving force generation mechanism and for providing a driving force that slides the second panel.

12 Claims, 7 Drawing Sheets

MOUNTING DEVICE AND AN AIR FLOW CONTROL DEVICE

CROSS-REFERENCE TO RELATED APPLICATION

This application is based upon and claims the benefit of priority of the prior Japanese Patent Application No.2010-214433, filed on Sep. 24, 2010, the entire contents of which are incorporated herein by reference.

FIELD

The embodiments discussed herein are related to a mounting device for electronic unit and an air flow control device.

BACKGROUND

A mounting device for electronic unit is known that includes a plurality of stages of shelves in each of which a plurality of electronic units, such as printed wiring boards on which a hard disk drive (HDD), a power supply, and an electronic part are mounted, are accommodated in parallel. A duct is provided in a device housing and a cooling fan is provided in the duct. Heat from the electronic units is led to the duct through airflow paths between the electronic units, and then discharged to the outside of the device housing. Japanese Laid-open Patent Publication Nos. 2007-73720 and 11-204974 are examples of related art Therefore, when the common cooling fan within the device housing is used to uniformly cool each electronic unit, it is desired that a cooling air for each electronic unit does not has a low pressure loss and is uniformed.

However, the plurality of electronic units included in the mounting device for electronic unit are different in height, are different in shape depending on mounted parts, and thus do not necessarily have the same shape. Therefore, when the shape of each electronic unit is different, the pressure loss of the cooling air for each electronic unit is different. In addition, the pressure loss of the cooling air for each electronic unit is different also depending on a manner of arranging the electronic units to the shelf of the mounting device for electronic unit. Therefore, it is desired to control a flow of the cooling air to be constant for each electronic unit.

SUMMARY

According to an aspect of the invention, a mounting device includes a housing in which accommodation portions accommodating a plurality of electronic units, respectively, are arranged in parallel, a fan configured to send cooling air to the plurality of electronic units and a plurality of air flow control devices, provided in an airflow path for the cooling air in accommodation portions, configured to control flow of the cooling air. Each air flow control device includes a first panel having at least one opening for the cooling air to pass therethrough, a second panel, slidably provided to overlap the first panel, configured to open or close the opening of the first panel, a driving force generation mechanism provided in the airflow path configured to cool air and have an air receiving member for receiving an air pressure of the cooling air, the driving force generation mechanism configured to generate a driving force corresponding to the air pressure received by the air receiving member and a link mechanism, coupled to the driving force generation mechanism and the second panel, configured to receive the driving force generated by the driving force generation mechanism and provide a driving force that slides the second panel.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present techniques will be explained with reference to accompanying drawings.

Figure 1:
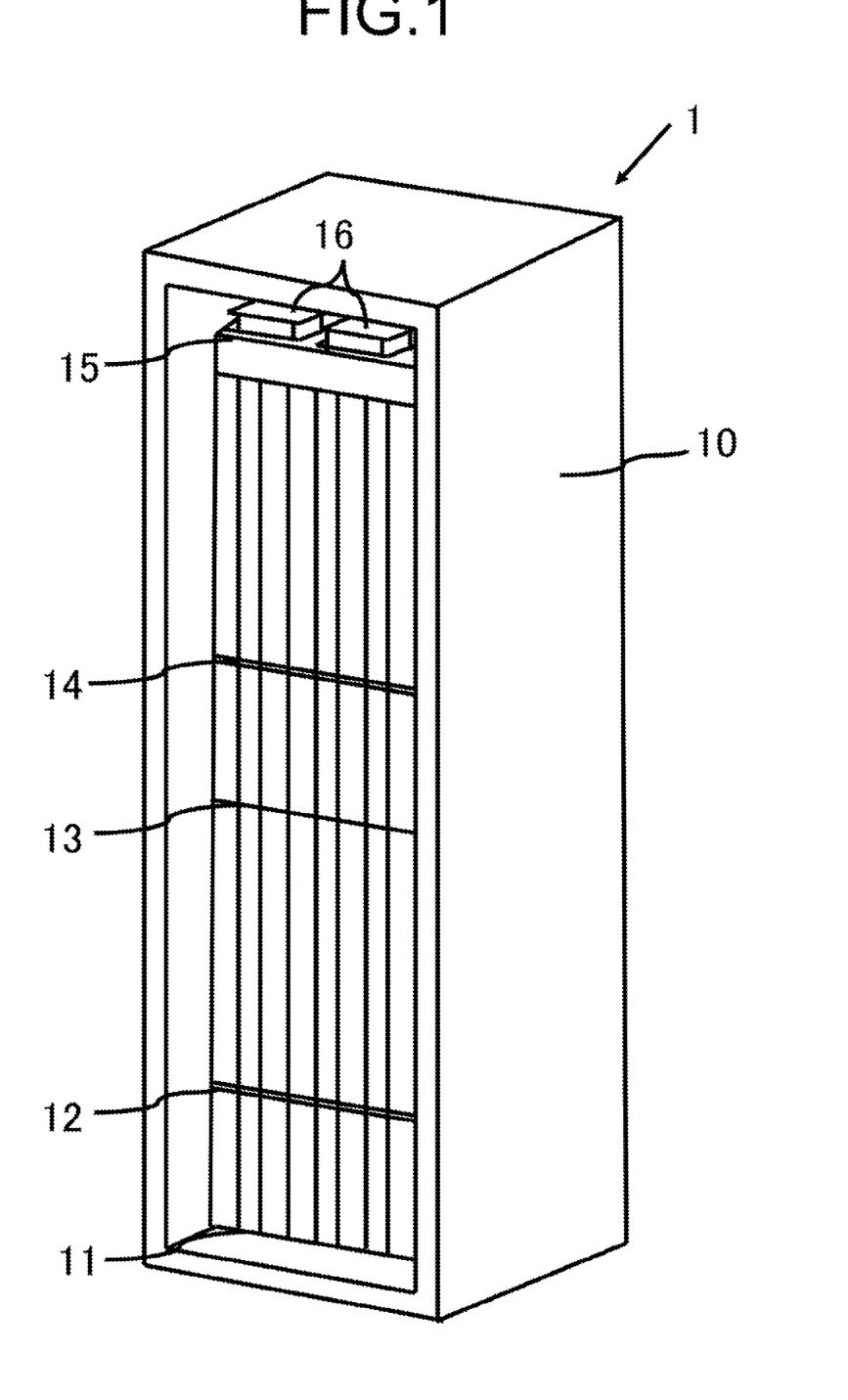
FIG. 1 is a perspective view illustrating a structure of a mounting device for electronic unit.
Figure 2:
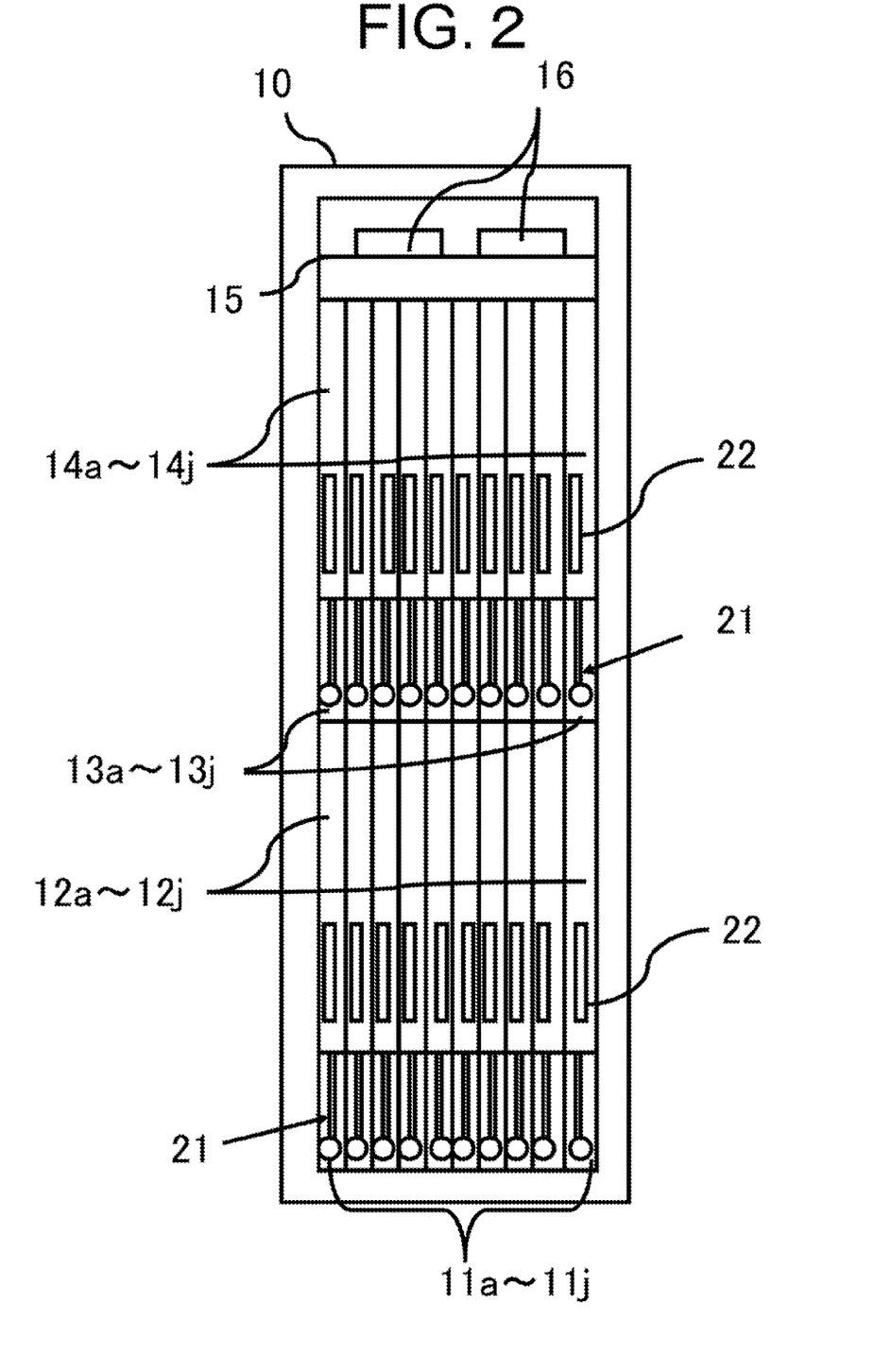
FIG. 2 is a front view illustrating the structure of the mounting device for electronic unit.

Hereinafter, an embodiment will be described in detail with reference to the drawings. FIG. 1 is a perspective view illustrating a structure of a mounting device for electronic unit. FIG. 2 is a front view illustrating the structure of the mounting device for electronic unit. The mounting device for electronic unit 1 according to the embodiment includes a housing 10 having a rectangular parallelepiped shape.

The housing 10 is provided with an accommodation space in an inside thereof, and is provided with a door (not shown) that closes the accommodation space. In the accommodation space, five stages of shelves 11 to 15 are provided. Each of the shelves 11 to 14 is provided with walls that divide the accommodation space into a plurality of portions, and a plurality of accommodation portions 11a to 11j, 12a to 12j, 13a to 13j, and 14a to 14j are provided.

An air flow control device 21 is mounted in each of the accommodation portions 11a to 11j of the shelf 11. An electronic unit 22 is mounted in each of the accommodation portions 12a to 12j of the shelf 12 above the shelf 11. Similarly, an air flow control device 21 is mounted in each of the accommodation portions 13a to 13j of the shelf 13. An electronic unit 22 is mounted in each of the accommodation portions 14a to 14j of the shelf 14 above the shelf 13.

A plurality of cooling fans 16 are mounted in the topmost shelf 15. The plurality of cooling fans 16 sends cooling air for cooling the electronic units 22. In the embodiment, the cooling fans 16 are driven so as to send the cooling air from bottom toward top.

Figure 3:
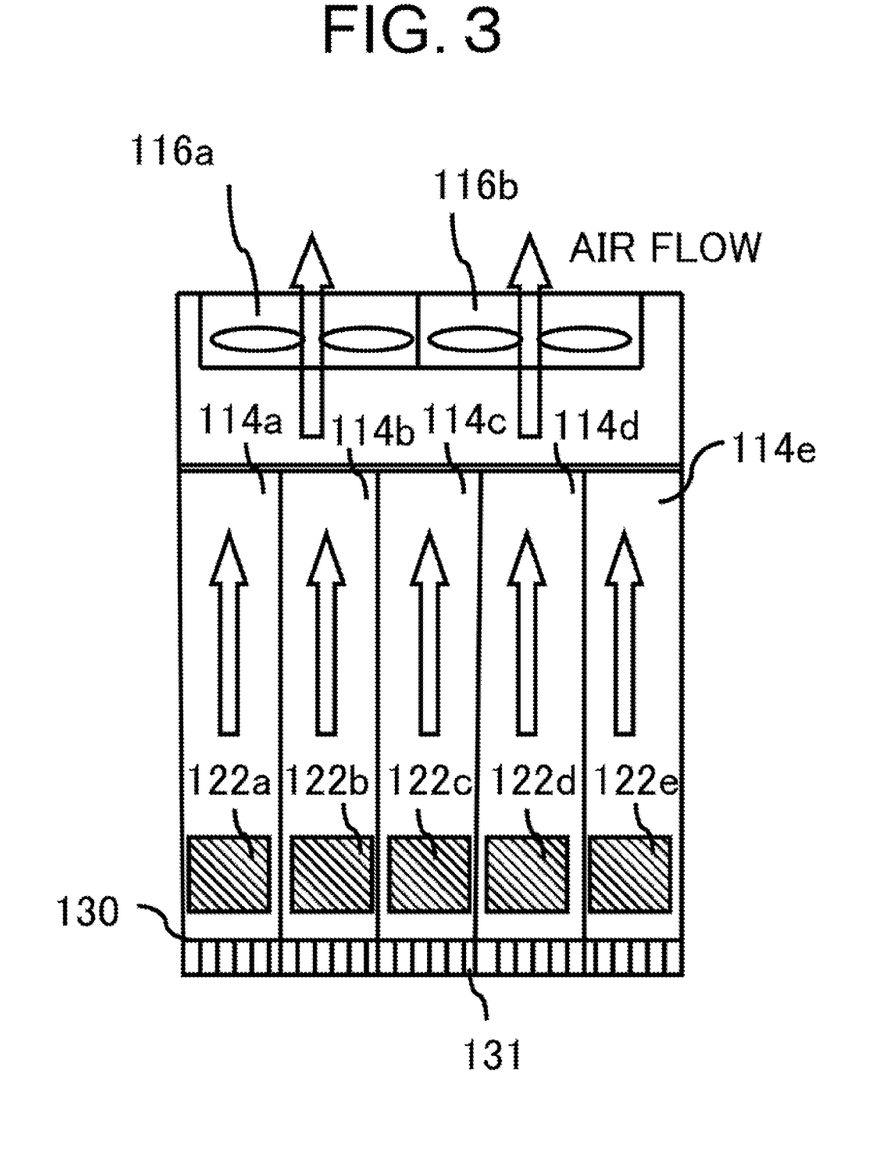
FIG. 3 is a diagram for illustrating an air flow control method according to a comparative example.

FIG. 3 is a diagram for illustrating an air flow control method according to a comparative example. Walls that divide an accommodation space into a plurality of portions are provided in the shelf, and accommodation portions 114a to 114e are formed. In the accommodation portions 114a to 114e, corresponding electronic units 122a to 122e are mounted. Cooling fans 116a and 116b are mounted above the accommodation portions 114a to 114e and are driven so as to suck cooling air from each accommodation portion and send cooling air from bottom toward top.

The electronic units 122a to 122e are of a plurality of types, and the pressure loss is different depending on the types. The higher the pressure loss is, the lower the flow of the cooling air is. The lower the pressure loss is, the higher the flow of the cooling air is. Therefore, due to the difference in pressure loss, the flow of the cooling air for each electronic unit does not become constant.

Therefore, in order to cause the flow of the cooling air flowing in each accommodation portion to be constant, an air flow adjusting plate 131 is provided on the suction side or discharge side of the accommodation portions 114a to 114e. In FIG. 3, the air flow adjusting plate 131 is provided at suction ports 130.

The air flow adjusting plate 131 is a metal plate provided with a plurality of openings. Here, each of suction ports at the accommodation portions 114a to 114e is designed so as to correspond to the difference in pressure loss of the cooling air between the electronic units 122a to 122e. In other words, the air flow adjusting plate 131 is designed such that the opening rate is high at a portion where the pressure loss is low and is low at a portion where the pressure loss is high.

Specifically, the shapes of the openings, the sizes of the openings, and the number of the openings of the air flow adjusting plate 131 are adjusted. By so doing, the flow of the cooling air sucked from the suction side of the accommodation portions 114a to 114e may be constant. It should be noted that when a plurality of stages of shelves are provided, an air flow adjusting plate 131 is similarly designed and arranged to each shelf.

However, the air flow adjusting plate 131 is designed according to electronic units mounted in the shelf. Thus, later, the arrangement of the electronic units may not be changed, and the electronic units may not be replaced with other ones. In addition, when an electronic unit is desired to be replaced, the air flow adjusting plate 131 needs to be designed all over again. Therefore, it is desired that air flow control is more easily and efficiently performed when electronic units having different pressure losses are additionally mounted in the mounting device for electronic unit.

Further, it is also considered that the air flow is monitored with an air flow sensor and the opening rate of the air flow adjusting plate 131 is changed by operating an electric shutter in accordance with the air flow. However, the electric control needs electric power and causes a heat source, and thus is not necessarily an efficient cooling method. Therefore, the air flow control is performed by a mechanical method without needing electric power.

Figure 4:
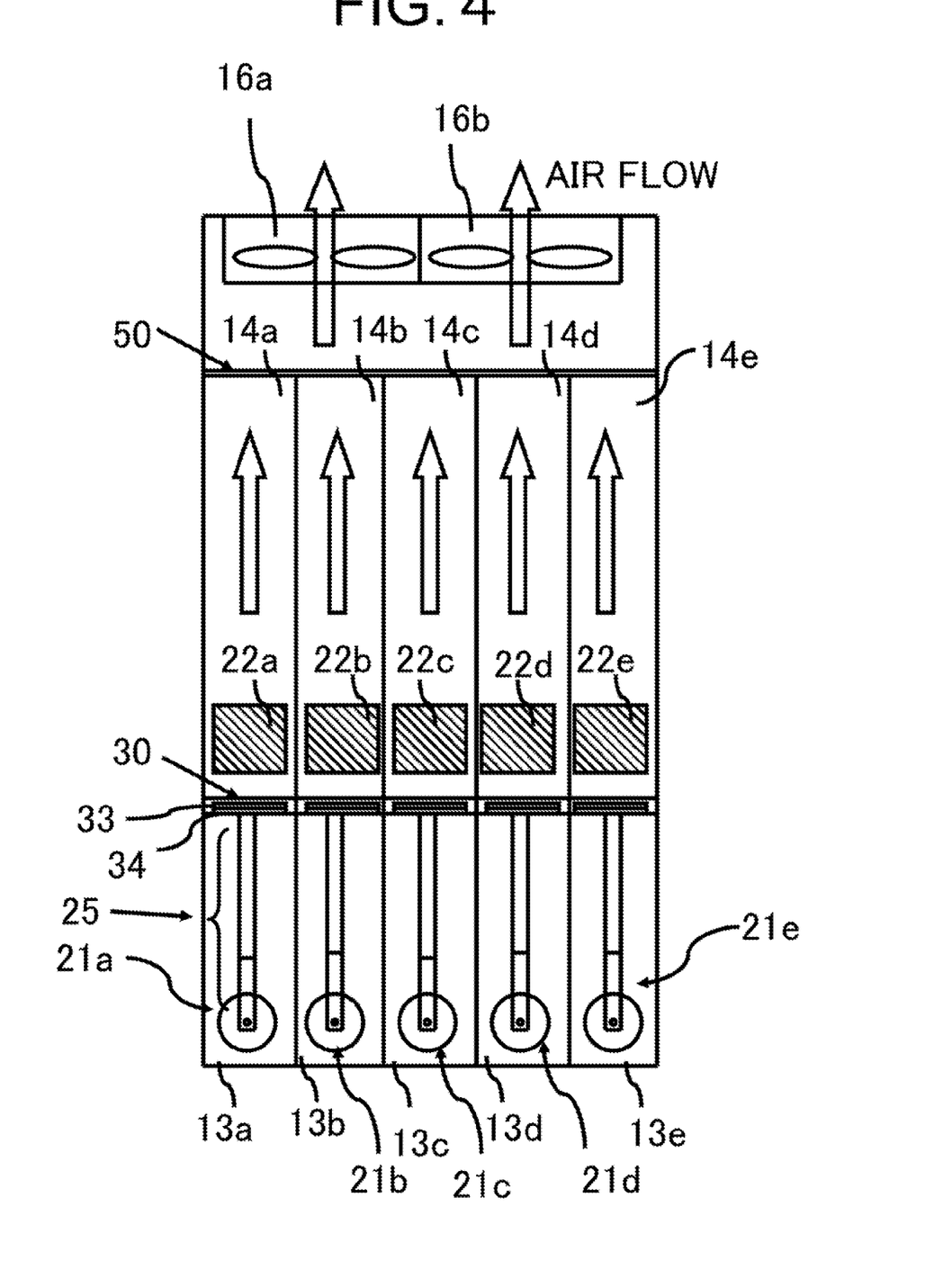
FIG. 4 is a diagram for illustrating an air flow control method according to an embodiment.

FIG. 4 is a diagram for illustrating an air flow control method according to the embodiment. FIG. 4 illustrates a part of the shelves 13 and 14 of the mounting device for electronic unit. Walls that divide the accommodation space into a plurality of portions are provided in the shelf, and the accommodation portions 14a to 14e are formed. In the accommodation portions 14a to 14e, corresponding electronic units 22a to 22e are mounted. Cooling fans 16a and 16b are mounted above the accommodation portions 14a to 14e and are driven so as to suck cooling air from each accommodation portion and send the cooling air from bottom to top.

The electronic units 22a to 22e are of different types, respectively, and have different pressure losses. Thus, in order to cause the flow of the cooling air flowing in each accommodation portion to be constant, a plurality of air flow control devices 21a to 21e are provided on the suction side or the discharge side of the accommodation portions 14a to 14e.

In FIG. 4, the air flow control devices 21a to 21e are provided to suction ports 30. It should be noted that when mounted on the discharge side, the air flow control devices are provided to a discharge port 50. Specifically, the air flow control devices 21a to 21e are located in the accommodation portions 13a to 13e that are airflow paths for cooling air flowing into the accommodation portions 14a to 14e. First and second panels 33 and 34 are located so as to overlap each other at positions where the accommodation portions 14a to 14e face the suction ports 30.

Driving force generation mechanisms 25 are located at the suction ports for the cooling air flowing into the accommodation portions 13a to 13e, and are rotated by air pressure. By using the rotation force, the second panel 34 slides relative to the first panel 33. The detailed configuration and operation will be described with reference to FIGS. 5 to 7B.

Figure 5:
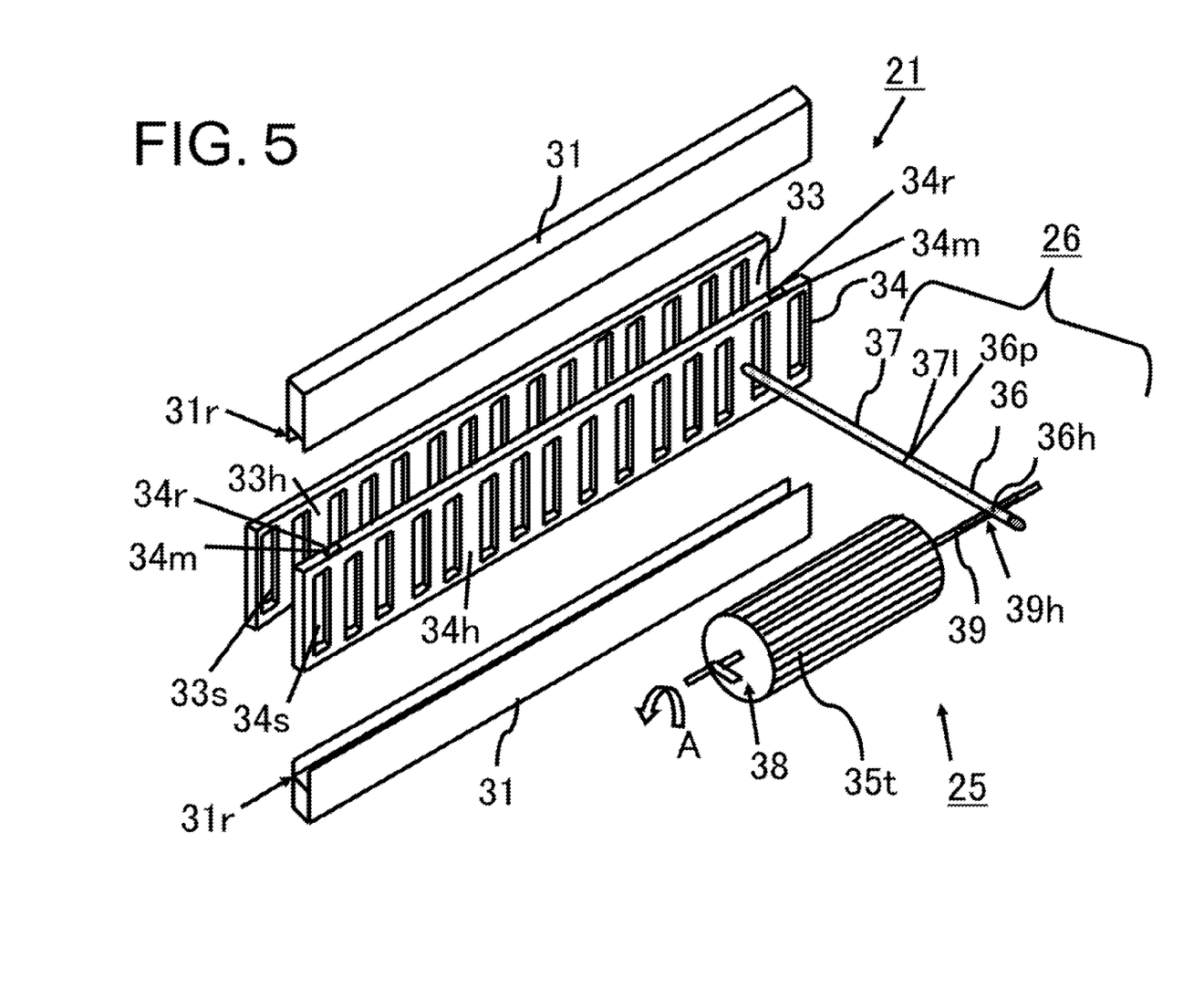
FIG. 5 is an exploded perspective view illustrating a structure of an air flow control device.
Figure 6A:
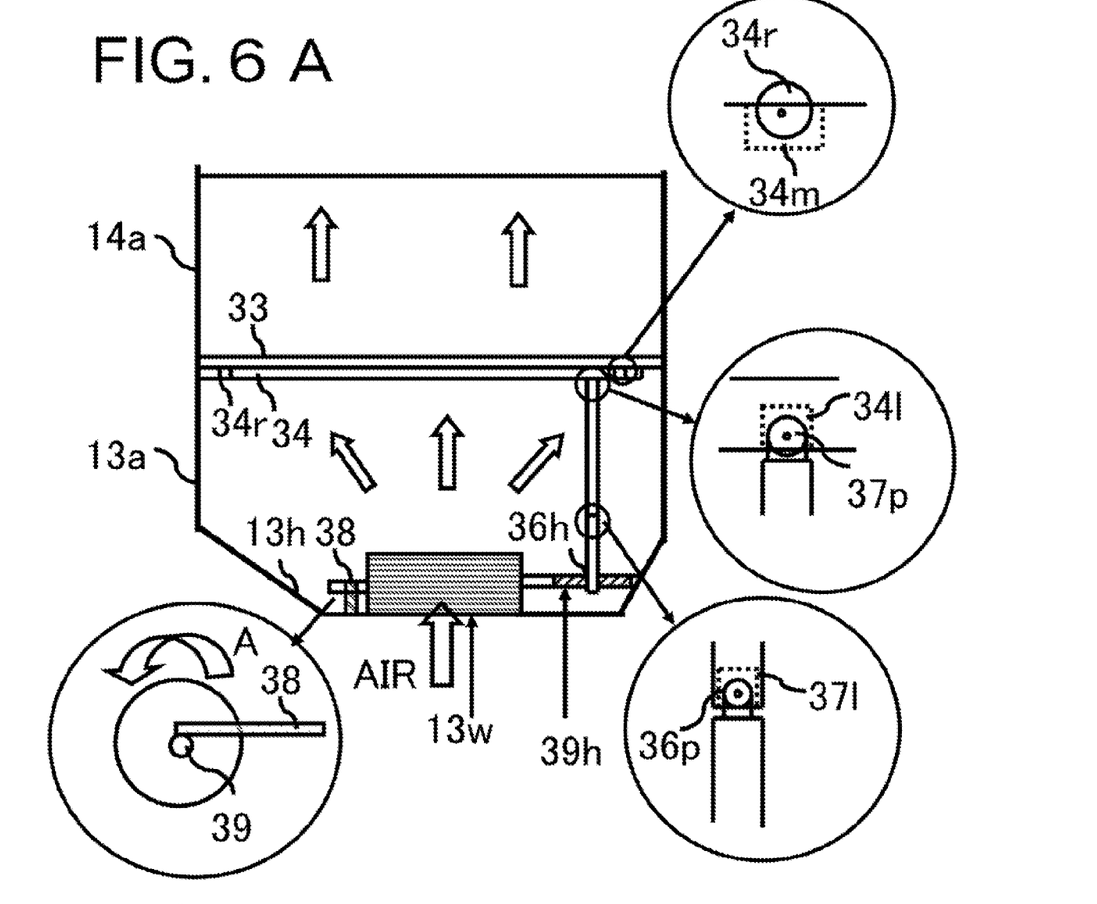
FIGS. 6A and 6B are plan views illustrating the structure of the air flow control device.
Figure 6B:
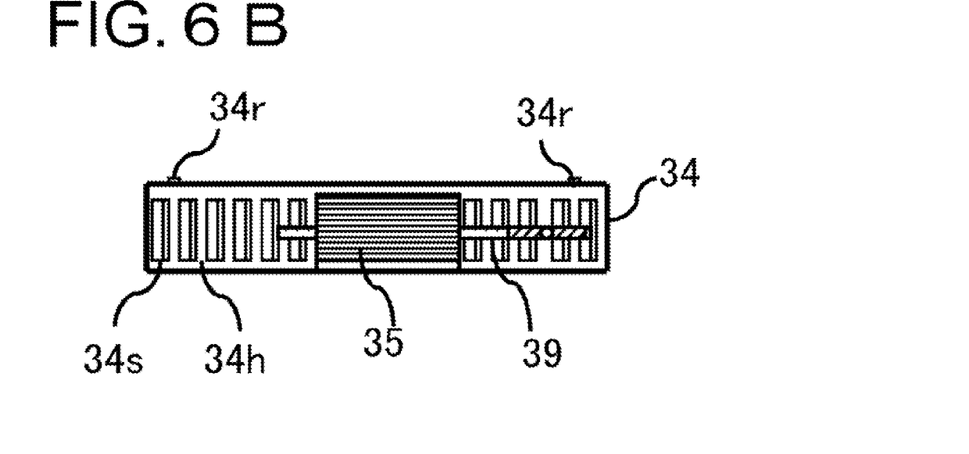
Figure 7:
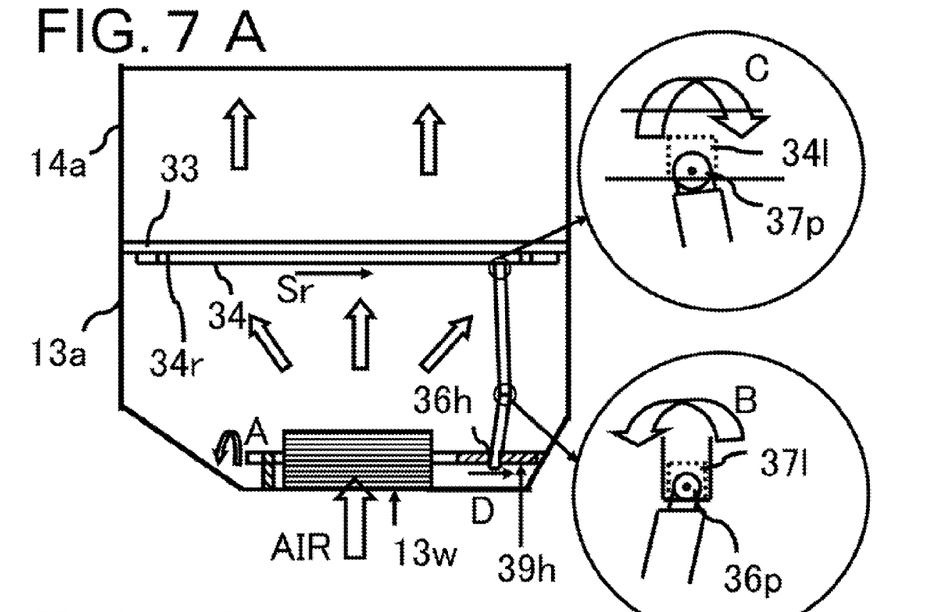
FIGS. 7A and 7B are diagrams illustrating an operation of the air flow control device.

FIG. 5 is an exploded perspective view illustrating a structure of the air flow control device. FIGS. 6A and 6B are plan views illustrating the structure of the air flow control device. FIGS. 6A and 6B illustrates a part of the accommodation portions 13a and 14a of the mounting device for electronic unit. The air flow control device 21 is located in the accommodation portion 13a that communicates with the suction port 30 of the accommodation portion 14a. The air flow control device 21 includes the first and second panels 33 and 34 and the driving force generation mechanism 25.

The first and second panels 33 and 34 are fitted to a peripheral wall surface of the suction port 30 of the accommodation portion 14a so as to overlap each other. The width of the second panel 34 is smaller than the width of the accommodation portion 14a. Upper and lower wall surfaces 31 are provided with rails 31r, respectively. The upper and lower portions of the first and second panels 33 and 34 are fitted into the rails 31r.

In upper, lower, left, and right grooves 34m of the second panel 34, cylindrical slide rollers 34r each of which is one example of a slide member are provided, respectively. Therefore, the slide rollers 34r roll and move along the rails 31r. As described above, the first panel 33 is fixed to the wall surfaces 31, but the second panel 34 is provided to the wall surfaces 31 so as to be slideable along the rails 31r.

Main surfaces 33h and 34h of the first and second panels 33 and 34 are provided with a plurality of rectangular slits 33s and 34s each of which is one example of an opening. These slits 33s and 34s have the same size and are arranged at regular intervals. It should be noted that the sizes, the shapes, and the arrangements of the slits may be determined in accordance with a needed opening rate. Therefore, the slits 33s and 34s may have different sizes, shapes, and arrangements.

When the second panel 34 moves in a closing direction (Sr direction), the slits 33s and 34s gradually shift from each other, and the main surface 33h of the first panel 33 overlaps the slits 34s. Similarly, the main surface 34h of the second panel 34 overlaps the slits 33s. Therefore, when the slits 33s and 34s completely coincide with each other, the opening rate of the slits 33s is 100%, and the opening rate of the slits 33s gradually decreases as the second panel 34 moves in the closing direction (Sr direction).

When the slits 33s and 34s completely shift from each other, the main surface 34h completely overlaps the slits 33s and the opening rate of the slits 33s becomes 0%. It should be noted that when the opening rate of the slits 33s is 0%, air does not flow into the accommodation portion of the electronic unit at all, and thus a minimum opening rate (e.g., 5%) is previously set so as to allow even a small amount of cooling air to flow in.

The driving force generation mechanism 25 generates a driving force for sliding the second panel 34 along the rails 31r. The driving force generation mechanism 25 includes a rotor (propeller) 35, an elastic member 38, and a link mechanism 26. The rotor 35 is a cylindrical windmill having, on its surface, a plurality of plate-like blades 35t each of which is one example of an air receiving member that receives cooling air.

A suction port 13w of the accommodation portion 13a is formed with a size that is the same as or smaller than the vertical and horizontal widths of the rotor 35, such that the blades 35t receive cooling air flowing into the accommodation portion 13a. Therefore, the flow of the cooling air flowing into the accommodation portion 13a is taken as accurate as possible, whereby flow control is performed.

The link mechanism 26 includes first and second rods 36 and 37. The first rod 36 has, at one end thereof, an internal thread (nut) 36h that is coupled to an external thread (bolt) 39h formed at one end of a shaft 39 of the rotor 35.

The second rod 37 is coupled at one end thereof to the first rod 36. A shaft portion 36p of the first rod 36 is rotatably provided in an engagement groove 371 at one end of the second rod 37. In addition, the second rod 37 is coupled at the other end thereof to the second panel 34. A shaft portion 37p of the second rod 37 is rotatably provided in an engagement groove 341 of the second panel 34.

FIGS. 7A and 7B are diagrams illustrating an operation of the air flow control device. It should be noted that FIG. 6A described above illustrates a state where the opening rate of the slits 33s is 100%, FIG. 7A illustrates a state where the slits 33s are slightly closed, and FIG. 7B illustrates a state where the opening rate of the slits 33s is the minimum.

FIG. 6A illustrates an initial state during stop of the cooling fan or a state where during operation of the cooling fan, the opening rate is controlled to be 100% by the air flow control device 21. In the embodiment, the opening rate in the initial state during stop of the cooling fan is previously set to 100%. Specifically, a plate rubber that is one example of the elastic member 38 is fixed at one end thereof to the shaft 39 and at the other end thereof to a wall surface 13h of the accommodation portion 13a.

Therefore, when a plurality of the blades 35t do not receive an air pressure equal to or higher than a predetermined value, the rotor 35 does not rotate due to the elastic force of the elastic member 38. Thus, the first rod 36 and the second rod 37 wait at initial positions. Therefore, the second panel 34 waits at an initial position, and the opening rate of the slits 33s is kept at 100%.

When a plurality of the blades 35t receive an air pressure equal to or higher than the predetermined value, the plate surfaces are pressed by the air pressure to generate a rotary force (A direction) that rotates the rotor 35. When the air pressure at that time is greater than the elastic force of the elastic member 38, the rotor 35 starts to rotate. Then, the rotary force is transmitted to the link mechanism 26 and converted into a driving force that moves the second panel 34 in the closing direction (Sr direction).

As shown in FIG. 7A, the internal thread 36h of the first rod 36 moves in a D direction along the external thread 39h with the rotation of the rotor 35 in the A direction. In other words, the external thread 39h has a thread groove that moves the internal thread 36h in the D direction when the rotor 35 rotates in the A direction.

The one end of the second rod 37 receives a rotary force (B direction) from the shaft portion 36p and rotates. In addition, the other end of the second rod 37 receives a rotary force (C direction) from the shaft portion 37p and presses the second panel 34 in the closing direction (Sr direction). Therefore, when the blades 35t receive an air pressure equal to or higher than the predetermined value, the second panel 34 is moved in the closing direction (Sr direction) such that the opening rate decreases.

When the blades 35t receives an air pressure of a maximum value that is previously set, the second panel 34 moves to a final position where the opening rate becomes the minimum. As shown in FIG. 7B, the internal thread 36h of the first rod 36 moves in the D direction along the external thread 39h to a final position with the rotation of the rotor 35.

The one end of the second rod 37 receives the rotary force (B direction) from the shaft portion 36p and rotates. In addition, the other end of the second rod 37 receives the rotary force (C direction) from the shaft portion 37p and presses the second panel 34 to a final position. Therefore, when the blades 35t receive the maximum air pressure, the second panel 34 is moved to the final position such that the opening rate becomes the minimum.

Then, when the air flow changes, the air flow and the elastic force of the elastic member 38 are balanced such that the second panel 34 is kept at the final position. When the air flow decreases and the air pressure falls, a driving force that inversely rotates the rotor 35 in an F direction opposite to the A direction is generated by the resilience force of the elastic member 38 in an E direction. The internal thread 36h of the first rod 36 moves along the external thread 39h in the direction opposite to the D direction with the inverse rotation of the rotor 35.

The one end of the second rod 37 receives a rotary force (the direction opposite to the B direction) from the shaft portion 36p and rotates. In addition, the other end of the second rod 37 receives a rotary force (the direction opposite to the C direction) from the shaft portion 37p and presses the second panel 34 in an opening direction (SI direction). Thus, the second panel 34 starts to move in the opening direction (SI direction), and when the air pressure decreases to the predetermined value or less, the second panel 34 returns to the initial position where the opening rate of the slits 33s becomes 100%.

Further, when the air flow and the elastic force of the elastic member 38 are balanced at an intermediate position between the initial position and the final position, the second panel 34 stops moving and is kept at that position until the air flow changes. Then, when the air flow decreases and the air pressure falls, the second panel 34 starts moving in the opening direction (SI direction) by the same operation as described above. In addition, when the air flow and the elastic force of the elastic member 38 are balanced, the second panel 34 stops moving and is kept at that position until the air flow changes.

Further, when the air pressure decreases to the predetermined value or less, the second panel 34 returns to the initial position where the opening rate of the slits 33s becomes 100%. On the other hand, when the air flow increases and the air pressure rises, the second panel 34 starts moving in the closing direction (Sr direction) by the same operation as described above. In this manner, the position of the second panel 34 is controlled in response to change of the air pressure received by the blades 35t.

As described above, the elastic member 38 is used for controlling movement of the second panel 34 in accordance with the air pressure received by the blades 35t. The elastic member 38 applies the elastic force such that the rotor 35 does not rotate in the A direction unless the blades 35t receive an air pressure equal to or higher than the predetermined value. In addition, the elastic member 38 applies the elastic force such that the rotor 35 inversely rotates in the F direction to return to the initial position when the air pressure changes to the predetermined value or less.

As one example of the elastic member 38, use of a rubber or a spring is considered. FIGS. 6A, 6B, 7A, and 7B illustrate one example where the plate rubber is used as the elastic member 38. The plate rubber, which is the elastic member 38, is fixed at one end thereof to the wall surface 13h of the accommodation portion 13a and at the other end thereof to the shaft 39 of the rotor 35. Therefore, when the shaft 39 rotates in the A direction, the plate rubber winds about the shaft 39 to generate a resilience force in the direction opposite to the rotation direction. When the rotary force in the A direction disappears and the air pressure becomes less than the predetermined value, the rotor 35 inversely rotates in the F direction to return to the initial position.

In this manner, the driving force generation mechanism 25 generates a driving force that moves the second panel 34 in the sliding direction, by using the air pressure of the cooling air and the elastic force of the elastic member 38.

Here, a method of setting the elastic force (urging force) of the elastic member 38 will be described. The spring constant of the elastic member 38 is set by a moving amount of the second panel 34. The opening rate of the suction port at the accommodation portion of a cooled object having an assumed maximum pressure loss is set to 100%. In addition, the opening rate of the suction port at the accommodation portion for a cooled object having an assumed minimum pressure loss is set to 5%. It should be noted that air does not flow at all if the opening rate is 0%, and thus such an opening ratio of 10% or less (not including 0) may be set that a very small amount of air flows.

An air pressure provided when a cooled object having the assumed minimum pressure loss is mounted is assumed, and the drawing amount of the elastic member 38 at that time is set such that the opening rate becomes 5%. The air pressure is determined by the capability and the number of the cooling fans and the sizes of cooled objects. The air pressure depends on conditions, and thus the air pressure is previously examined and determined.

Where an assumed air pressure and a drawing amount of the elastic member that are provided when the opening rate is 5% are indicated by Fmax and Tmax, an elastic member of which the spring constant is Fmax/Tmax is selected. The shape and material of the elastic member are arbitrarily selectable as long as it has the desired spring constant.

According to the configuration described above, the rotor (propeller) 35 rotates by the air pressure of the cooling fan mounted in the mounting device for electronic unit. Therefore, the lower the pressure loss is, the higher the air pressure is, and the higher the air pressure is, the more the rotor 35 rotates and the lower the opening rate of the slits 34s of the first panel 34 is. The lower the opening rate is, the lower the air pressure is and the less the rotor 35 rotates.

As a result, the air flow control device provided per electronic unit similarly moves, whereby the air pressure of the cooling air for each electronic unit is balanced. Therefore, the pressure loss of the cooling air for each electronic unit is uniformed, and the air flow becomes constant.

The disclosed mounting device for electronic unit and air flow control devices allow the flow of the cooling air cooling the electronic units to be easily controlled, by changing the opening rate at the airflow paths for the cooling air in the electronic units by using the air pressure of the cooling air, regardless of the shapes and the arranging method of the electronic units.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A mounting device comprising:
    a housing in which accommodation portions accommodating a plurality of electronic units, respectively, are arranged in parallel;
    a fan configured to send cooling air to the plurality of electronic units; and
    a plurality of air flow control devices, provided in an airflow path for the cooling air in accommodation portions, configured to control flow of the cooling air,
    wherein
    each air flow control device includes:
        a first panel having at least one opening for the cooling air to pass therethrough;
        a second panel, slidably provided to overlap the first panel, configured to open or close the opening of the first panel;
        a driving force generation mechanism provided in the airflow path configured to cool air and have an air receiving member for receiving an air pressure of the cooling air, the driving force generation mechanism configured to generate a driving force corresponding to the air pressure received by the air receiving member; and
        a link mechanism, coupled to the driving force generation mechanism and the second panel, configured to receive the driving force generated by the driving force generation mechanism and provide a driving force that slides the second panel.

2. A mounting device according to claim 1, wherein
the driving force generation mechanism includes an elastic member and provides a driving force for sliding the second panel in a closing direction, to the link mechanism by using the air pressure received by the air receiving member when the air pressure is greater than an elastic force of the elastic member.

3. A mounting device according to claim 1, wherein
the driving force generation mechanism includes an elastic member and provides a driving force for sliding the second panel in an opening direction, to the link mechanism by using the elastic force of the elastic member when the air pressure is smaller than the elastic force of the elastic member.

4. A mounting device according to claim 1, wherein
the driving force generation mechanism includes a rotor, and
the link mechanism includes a first rod for receiving a rotary force generated by the driving force generation mechanism and moving straight, and a second rod, coupled at one end thereof to the first rod and coupled at another end thereof to the second panel, for rotating about an axis.

5. A mounting device according to claim 4, wherein
the first rod has an internal thread, a shaft of the rotor has an external thread, the internal thread and the external thread are coupled to each other, and the internal thread moves straight by the external thread rotating.

6. A mounting device according to claim 1, wherein
the air flow control device is provided on a suction port side or a discharge port side of the accommodation portion.

7. An air flow control device controlling flow of cooling air, the flow control devices comprising:
 a first panel having at least one opening for the cooling air to pass therethrough;
 a second panel, slidably provided to overlap the first panel, configured to open or close the opening of the first panel;
 a driving force generator provided in the airflow path configured to cool air and have an air receiving member for receiving an air pressure of the cooling air, the driving force generation mechanism configured to generate a driving force corresponding to the air pressure received by the air receiving member; and
 a link member, coupled to the driving force generator and the second panel, configured to receive the driving force generated by the driving force generator and provide a driving force that slides the second panel.

8. An air flow control device according to claim 7, wherein
the driving force generator includes an elastic member and provides a driving force for sliding the second panel in a closing direction, to the link member by using the air pressure received by the air receiving member when the air pressure is greater than an elastic force of the elastic member.

9. An air flow control device according to claim 7, wherein
the driving force generator includes an elastic member and provides a driving force for sliding the second panel in an opening direction, to the link mechanism by using the elastic force of the elastic member when the air pressure is smaller than the elastic force of the elastic member.

10. An air flow control device according to claim 7, wherein
the driving force generator includes a rotor, and
the link member includes a first rod for receiving a rotary force generated by the driving force generation mechanism and moving straight, and a second rod, coupled at one end thereof to the first rod and coupled at another end thereof to the second panel, for rotating about an axis.

11. An air flow control device according to claim 10, wherein
the first rod has an internal thread, a shaft of the rotor has an external thread, the internal thread and the external thread are coupled to each other, and the internal thread moves straight by the external thread rotating.

12. An air flow control device according to claim 11, wherein
an elastic member is provided to the shaft such that the elastic member winds about a shaft of the rotor when the rotor rotates in a predetermined direction.

* * * * *